(12) United States Patent
Nulman et al.

(10) Patent No.: US 6,955,517 B2
(45) Date of Patent: Oct. 18, 2005

(54) APPARATUS FOR STORING AND MOVING A CASSETTE

(75) Inventors: Jaim Nulman, Palo Alto, CA (US); Nissim Sidi, Tel Aviv (IL)

(73) Assignee: Applied Materials, Inc., Santa Clara, CA (US)

(*) Notice: Subject to any disclaimer, the term of this patent is extended or adjusted under 35 U.S.C. 154(b) by 80 days.

(21) Appl. No.: 10/263,163

(22) Filed: Oct. 2, 2002

(65) Prior Publication Data

US 2003/0031539 A1 Feb. 13, 2003

Related U.S. Application Data

(62) Division of application No. 09/527,092, filed on Mar. 16, 2000, now Pat. No. 6,506,009.

(51) Int. Cl.[7] .............................................. B65G 15/58
(52) U.S. Cl. .................................. 414/222.01; 414/217
(58) Field of Search ............................... 414/217, 217.1, 414/940, 939, 222.01, 522, 468.6

(56) References Cited

U.S. PATENT DOCUMENTS

| 4,964,776 A | 10/1990 | Wakita et al. |
| 5,064,337 A | 11/1991 | Asakawa et al. |
| 5,246,218 A | 9/1993 | Yap et al. |
| 5,387,265 A | 2/1995 | Kakizaki et al. |
| 5,586,585 A | 12/1996 | Bonora et al. |
| 5,628,604 A | 5/1997 | Murata et al. |
| 5,955,857 A | 9/1999 | Kwon et al. |
| 5,980,183 A | 11/1999 | Fosnight |
| 6,042,324 A | 3/2000 | Aggarwal et al. |
| 6,079,927 A | 6/2000 | Muka |
| 6,142,722 A * | 11/2000 | Genov, deceased et al. 414/217 |
| 6,283,692 B1 | 9/2001 | Perlov et al. |
| 6,304,051 B1 * | 10/2001 | Sagues et al. ......... 318/568.11 |
| 6,379,096 B1 * | 4/2002 | Beutler et al. .............. 414/281 |
| 6,435,330 B1 | 8/2002 | Bonora et al. |
| 6,468,021 B1 * | 10/2002 | Bonora et al. .............. 414/522 |
| 6,481,558 B1 | 11/2002 | Bonora et al. |
| 6,517,304 B1 * | 2/2003 | Matsumoto ................. 414/217 |
| 6,579,052 B1 | 6/2003 | Bonora et al. |

FOREIGN PATENT DOCUMENTS

| WO | WO 98/46503 | 10/1998 |
| WO | WO 99/02436 | 1/1999 |
| WO | WO 99/54921 | 10/1999 |
| WO | WO 99/60614 | 11/1999 |

* cited by examiner

Primary Examiner—Eileen D. Lillis
Assistant Examiner—Charles A. Fox
(74) Attorney, Agent, or Firm—Dugan & Dugan LLP

(57) ABSTRACT

A cassette stocker includes a plurality of cassette storage shelves positioned adjacent a cleanroom wall and vertically disposed relative to a plurality of cassette docking stations, and a cassette mover to carry a cassette between the shelves and the docking stations. An interstation transfer apparatus includes a support beam and a transfer arm adapted to carry a cassette between processing stations.

42 Claims, 15 Drawing Sheets

APPARATUS FOR STORING AND MOVING A CASSETTE

This application is a division of U.S. patent application Ser. No. 09/527,092, filed Mar. 16, 2000 (issued as U.S. Pat. No. 6,506,009 on Jan. 14, 2003) which is hereby incorporated by reference herein in its entirety.

FIELD OF THE INVENTION

The present invention relates generally to substrate processing, and more particularly to an apparatus for storing and moving substrate cassettes.

BACKGROUND OF THE INVENTION

Semiconductor devices are made on substrates, such as silicon wafers or glass plates, for use in computers, monitors, and the like. These devices are made by a sequence of fabrication steps, such as thin film deposition, oxidation or nitration, etching, polishing, and thermal and lithographic processing. Although multiple fabrication steps may be performed in a single processing station, substrates must be transported between different processing stations for at least some of the fabrication steps. In addition, random substrates in a particular batch may be tested using metrology devices which require additional stations. Substrates are stored in cassettes for transfer between processing stations, metrology stations and other locations. Although cassettes may be carried manually between processing stations, the transfer of cassettes is typically automated. For example, a cassette may be transported to a processing station in an automatic guided vehicle (AGV), and then loaded from the AGV onto a loading platform in the processing station by a robot. Another robot may extract a substrate from the cassette and transport it into a processing chamber at the processing station. When the fabrication steps are complete, the substrate is loaded back into the cassette. Once all of the substrates have been processed and returned to the cassette, the cassette is removed from the loading platform and transported to another location by the AGV.

In order to ensure that the processing equipment does not sit idle, a nearly continuous supply of unprocessed substrates should be available at the processing station. Unfortunately, many processing stations can hold only a single cassette at the loading platform. Therefore, once all of the substrates in the cassette have been processed, the cassette must be quickly replaced, either manually or by an AGV, with a new cassette containing unprocessed substrates. Running such a just-in-time cassette inventory system requires either significant operator oversight or a large number of AGVs, thereby increasing the costs of the fabrication facility.

Therefore, there is a need for a method and apparatus which continuously supplies substrate cassettes to a processing system so that system down time is reduced or eliminated.

SUMMARY OF THE INVENTION

The present invention provides a method and apparatus for storing multiple cassettes at a processing station, ensuring that a nearly continuous supply of unprocessed substrates is available for processing and that the processing equipment does not idle. Multiple cassettes can be stored at a processing station in a front end support frame and a cassette can be moved to one of a plurality of vertically disposed docking stations where substrates are extracted and transferred to the processing equipment. An automation system is mounted or otherwise disposed on the frame to transfer cassettes between docking stations or between processing stations. In another aspect of the invention, cassettes can be transported between different processing stations without the use of an AGV.

In one aspect of the invention, an apparatus is provided which includes a front end frame having a plurality of vertically disposed docking stations and multiple cassette storage stations. An automated transfer assembly is preferably disposed adjacent the docking stations and the storage stations to move cassettes between the storage stations and the docking stations. Additionally, an automated transfer assembly can be located between processing stations to transfer cassettes between processing stations without the need for manual or AGV assistance. In another aspect of the invention, a method is provided for delivering a continuous supply of cassettes to a processing system. The method preferably includes providing a plurality of vertically disposed docking stations and multiple storage stations and moving cassettes between the storage stations and the transfer stations to ensure that substrates are continually supplied to the processing system. Additionally, a method is provided for transferring cassettes between processing stations to continue the processing sequence without the need for manual or AGV assistance.

Other objects, features and advantages of the present invention will become more fully apparent from the following detailed description of the preferred embodiments, the appended claims and the accompanying drawings.

DETAILED DESCRIPTION OF A PREFERRED EMBODIMENT

In the following description, the term "substrate" broadly covers any object that is being processed in a semiconductor device processing system. The term "substrate" includes, for example, semiconductor wafers, flat panel displays, glass plates or disks, and plastic workpieces.

Figure 1:
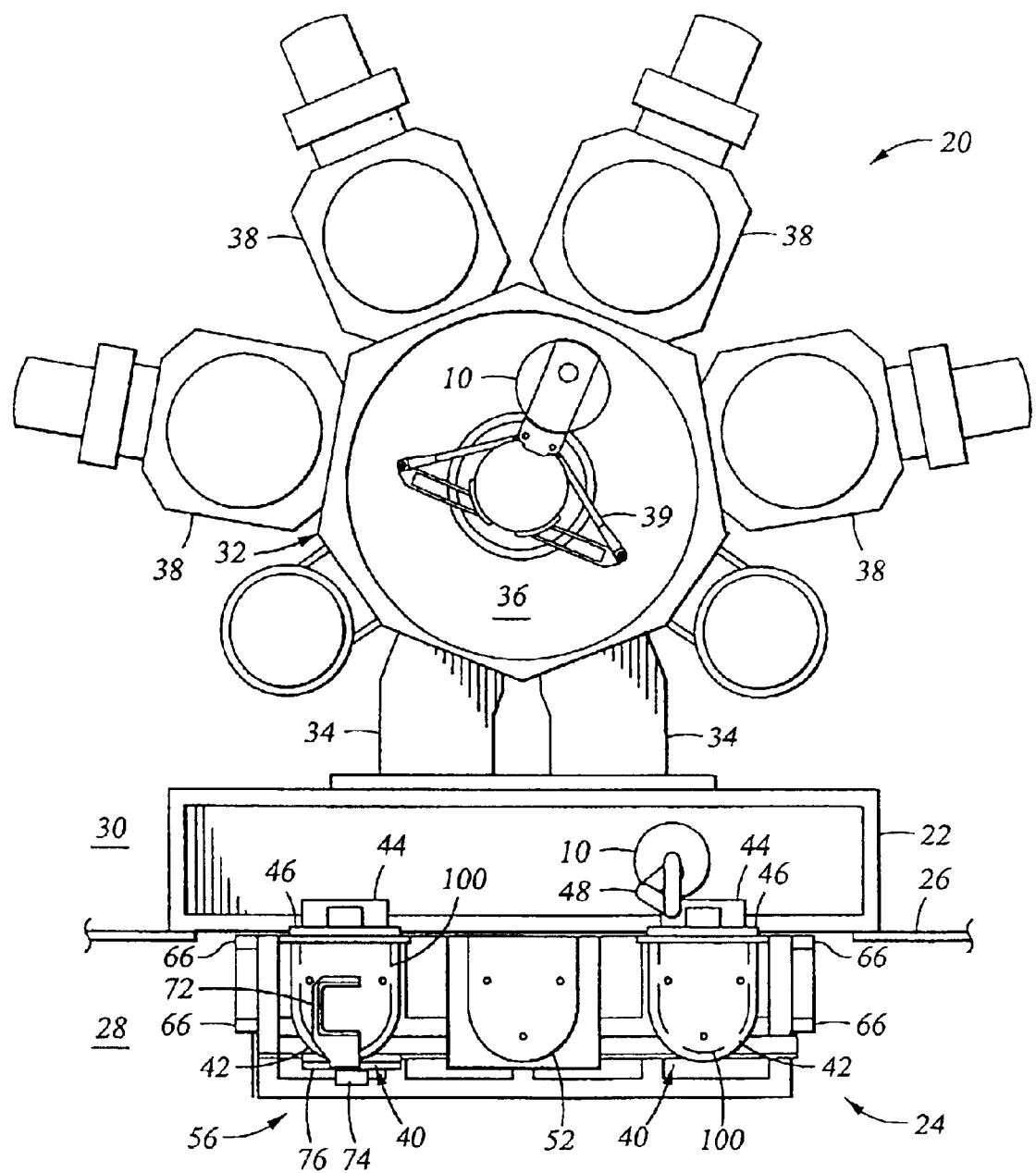
FIG. 1 is a schematic top view of a processing station according to the present invention.

FIG. 1 is a top view of a processing station 20 of the present invention in which one or more substrates 10 are processed. The processing station 20 has a front-end staging area 22 which is separated from a loading and storage area 24 by a cleanroom wall 26. Cleanroom wall 26 separates a cleanroom 28, where loading and storage area 24 is located, from a gray area 30, where a processing system 32 is housed. The loading and storage area 24 is where cassettes of substrates are delivered and loaded/unloaded into/from the processing station 20. Processing system 32 may include one or more load lock chambers 34, a central transfer chamber 36, and a plurality of processing chambers 38. Inside processing chambers 38 the substrate may be subjected to a variety of fabrication steps, such as thin film deposition, oxidation, nitration, etching, thermal processing or lithographic processing. The processing system and staging area illustrated in FIG. 1 are merely representative. The processing system could have just a single processing chamber, or it could be a device, such as a chemical mechanical polisher, that does not include any processing chambers. In addition, the processing system could include metrology devices instead of or in addition to processing devices.

Figure 2:
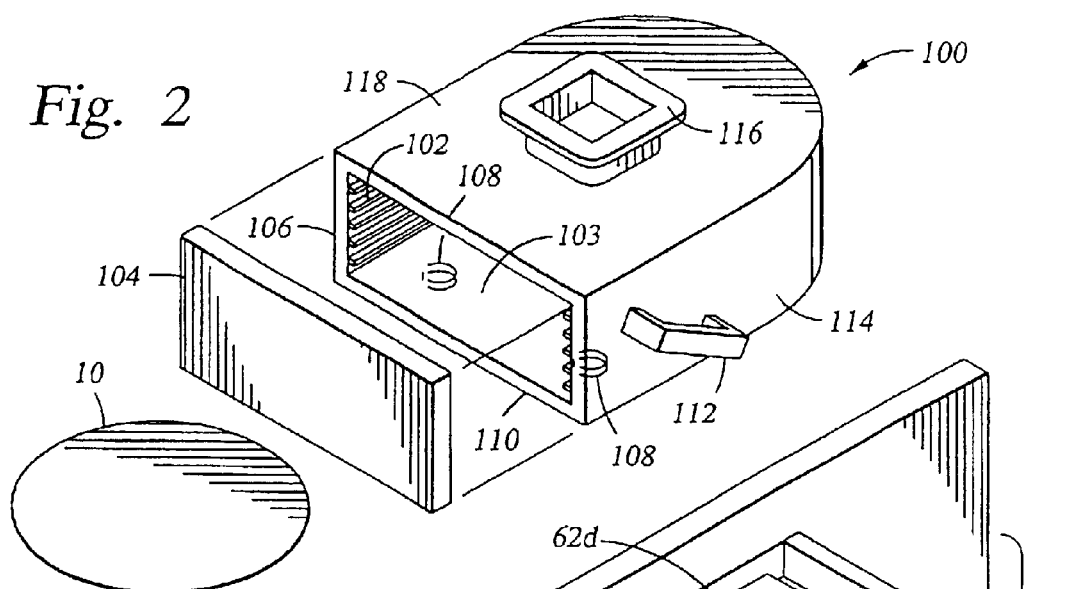
FIG. 2 is a schematic perspective view of a cassette for holding substrates.

Referring to FIGS. 1 and 2, one or more substrates 10 are brought to the loading and storage area 24 of the processing station in a cassette 100. Substrates 10 are supported in cassette 100 in a generally parallel horizontal configuration by slot ridges 102. Substrates may be loaded and unloaded from cassette 100 through an entry port 103 located in a generally flat front face 106 of the cassette. A removable cassette door 104 may be secured to entry port 103 to prevent the substrates from being exposed to contaminants when the cassette is moved between processing stations or stored outside a processing station. Each cassette 100 also includes three cylindrical indentations 108 (shown in phantom and only two of which are visible in FIG. 2) formed in an underside 110 of the cassette. When cassette 100 is stored at the processing station, three support pins will fit into indentations 108 to support the cassette. Two handles 112 (only one is shown in this perspective view) which project from sidewalls 114 may be used to manually carry the cassette. A generally rectangular flange 116 having an L-shaped cross-section projects from a top surface 118 of the cassette. As discussed below, a robotic cassette mover at the processing station may manipulate the cassette by means of flange 116.

Referring to FIGS. 1–5B, loading and storage area 24 of processing station 20 includes a cassette loading platform 52, two cassette substrate transfer or docking stations 40 located on either side of loading platform 52, and a cassette stocker or storage stations 50 (only partially illustrated in FIG. 1 so that docking stations 40 may be seen) for storing cassettes at the processing station and moving the cassettes to and from loading platform 52 and docking stations 40.

A cassette 100 may be placed on or removed from loading platform 52 either manually or by an AGV. From the loading platform 52, the cassette 100 may be moved to one of docking stations 40 or into cassette stocker 50. Loading platform 52 has generally the same perimeter shape as a cassette. Three support pins 64 (only two are shown in the side view of FIG. 5A) project vertically from the loading platform 52 to mate with the indentations in the underside of the cassette 100 and thus to secure the cassette on the loading platform 52.

To transfer substrates through the cleanroom wall 26, cassettes 100 (shown in phantom in FIG. 1) may be positioned at one or both docking stations 40. Each docking station 40 includes a docking platform 42 to support a cassette, an opening 46 formed through cleanroom wall 26, a movable door 44 which seals opening 46 when a substrate is not to be transferred through opening 46 or when a cassette is not positioned on docking platform 42, and a mechanism to unlock cassette door 104 and retract the door 104 into front-end staging area 22 to provide horizontal access to the substrates stored within the cassette. For example, the moveable door 44 may behave as a "receiver" and receive the cassette door 104 of a cassette, and then move below the opening 46 (carrying the cassette door 104) so as to allow horizontal access through the opening 46 to substrates stored within the cassette. A description of the preferred configuration and operation of docking station 40 may be found in U.S. patent application Ser. No. 09/012,323, entitled "A Wafer Cassette Load Station", filed Jan. 23, 1998, by Eric A. Nering, et al., assigned to the assignee of the present invention, the entire disclosure of which is incorporated herein by reference.

Cassette stocker 50 includes a frame 60 that supports one or more storage racks 58 (shown in FIG. 4A and not illustrated in FIG. 1 so that the docking stations may be shown), and a robotic cassette mover 56 to move the cassettes between the storage rack 58, the loading platform 52, and the docking platforms 42. Frame 60 may be bolted to the floor of cleanroom 28 and/or secured to the cleanroom wall 26. The frame 60 is at least partially disposed below the docking platforms 42 and loading platform 52 so that the footprint of processing station 20 is minimally increased if increased at all.

Storage rack 58 may include a vertical column of support shelves 62 above each of the two docking stations 40. Each column may include, for example, one, two, three or more individual support shelves 62. Thus, storage rack 58 shown in FIGS. 3–5B provides storage space for six cassettes 100 in support shelves 62a–62f (see FIG. 4B). Each support shelf, such as support shelf 62a, may be a horizontally oriented plate having substantially the same perimeter shape as the cassette 100. Three support pins 64 (only two are shown in the side view of FIG. 5A) project vertically from the support shelf 62 and are positioned to mate with receiving indentations 108 in the underside of the cassette 100. Two vertical posts 66 may be used to secure the outer edge of each support shelf 62a–62f to frame 60. Additionally, the support shelves 62 could be secured to the cleanroom wall for additional support.

Robotic cassette mover 56 is used to move cassettes 100 between the storage shelves 62, the loading platform 52 and the docking platforms 42. The robotic cassette mover 56 includes a vertically movable end effector 72 which is attached to a horizontally movable support strut 74. The support strut 74 permits arbitrary horizontal movement of end effector 72 in a plane parallel to cleanroom wall 26. The bottom of support strut 74 may be secured to a lateral slider 76 which can move horizontally along a horizontal guide 78 that is attached to or formed as part of frame 60. The lateral slider 76 may be driven from side-to-side by a horizontal lead screw 80, which is rotated by a horizontal drive motor 82. The horizontal drive motor 82 may be secured to frame 60. Similarly, end effector 72 may be attached to a vertical slider 84 (FIG. 4B) which can slide vertically along a vertical guide 86 (FIG. 5B) attached to or formed as part of support strut 74. The vertical slider 84 may be driven up and down by a vertical lead screw 87 (shown in phantom in FIGS. 4A–5B) which may be rotated by a vertical drive motor 88. The vertical drive motor may be supported by lateral slider 76. Horizontal drive motor 82 and vertical drive motor 88 may be connected to a control system (not shown), such as a programmable digital computer, to control the vertical and horizontal motion of end effector 72. The actuators which drive the movement of the end effector 72 may include stepper motors, pneumatic actuators and other devices known to impart movement in a controllable manner. In addition, a belt drive assembly or other known mechanism can be utilized to drive the sliders both vertically and horizontally.

Figure 6:
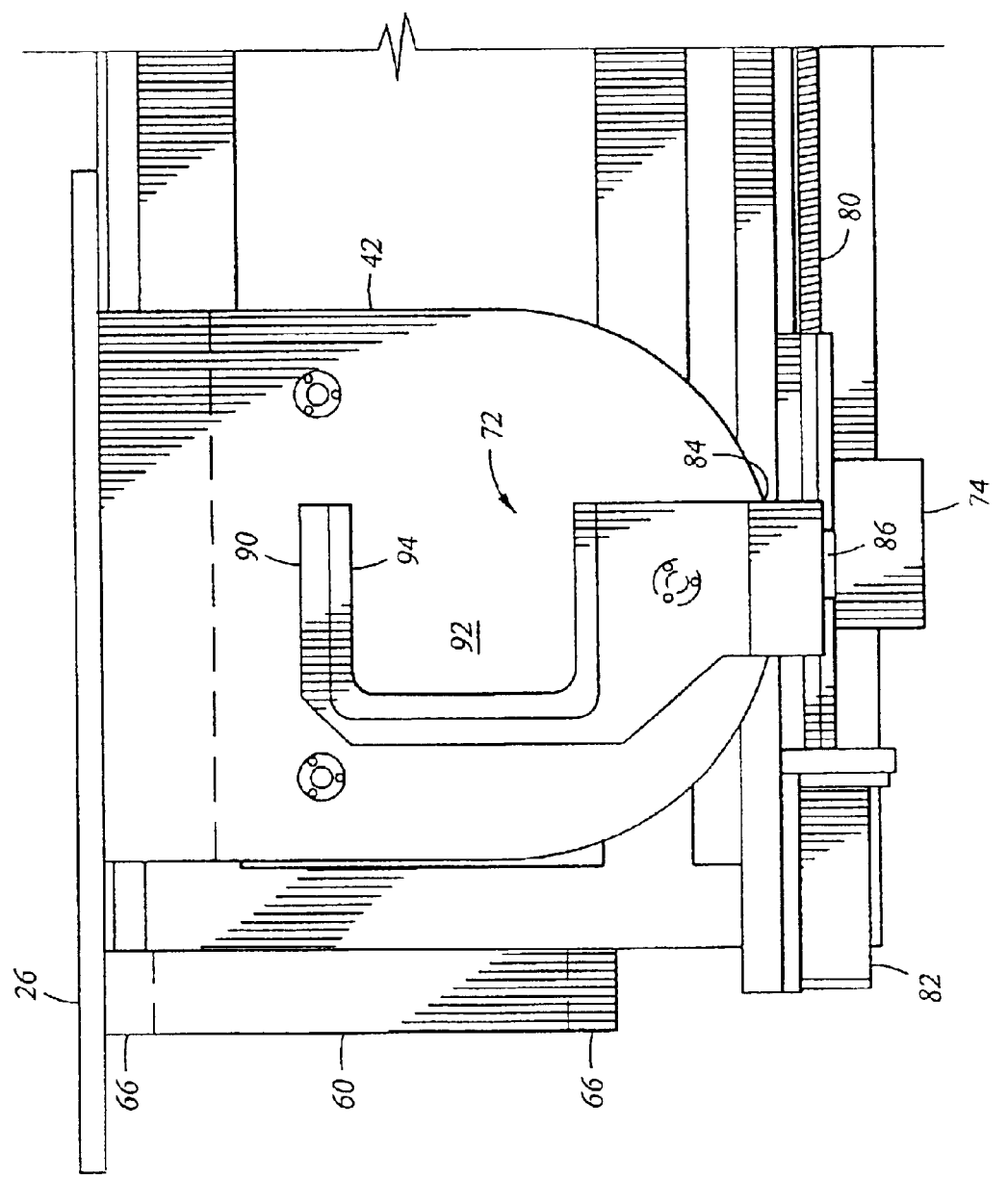
FIG. 6 is a schematic top view of an end effector located over a docking station.
Figure 7A:
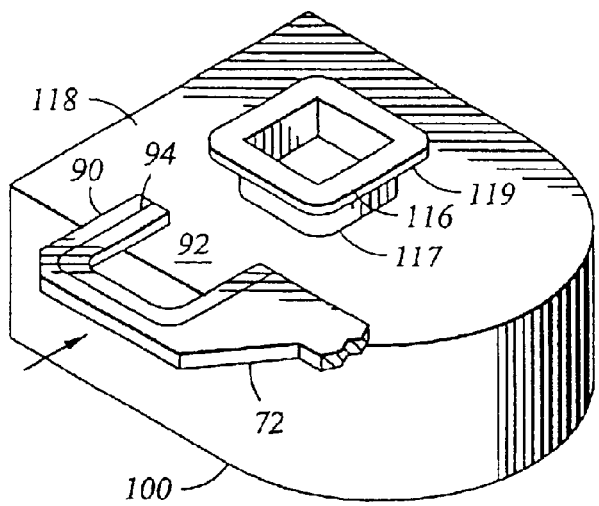
FIGS. 7A, 7B and 7C are schematic perspective views illustrating the end effector of FIG. 6 lifting and moving a cassette.
Figure 7B:
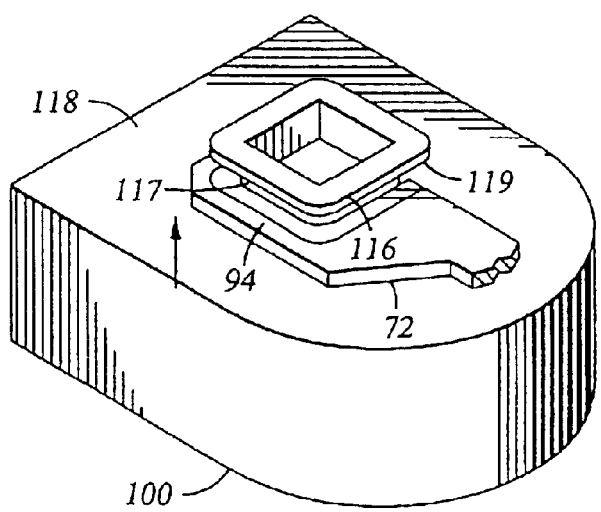
Figure 7C:
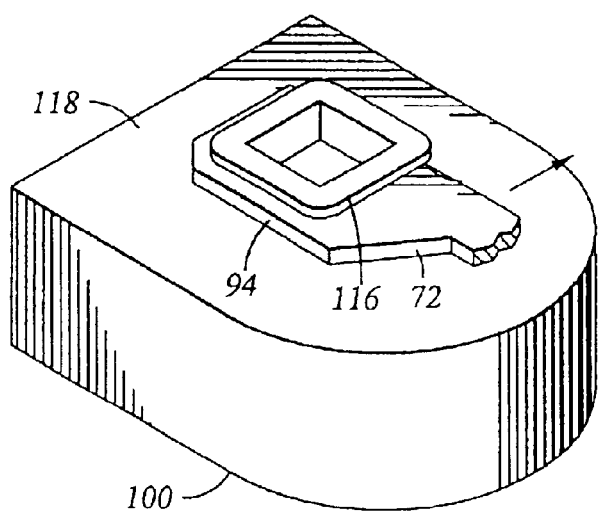

Referring to FIGS. 6–7A, end effector 72 projects horizontally from support strut 74 toward cleanroom wall 26. The end effector 72 includes a generally flat, hook-shaped finger 90 that defines a rectangular gap 92 which is open on one side of the end effector 72. The end effector 72 is adapted to engage a portion of a cassette 100 through the use of the open end of the end effector 72. In order to transport cassette 100, end effector 72 is vertically positioned between flange 116 and top surface 118 of cassette 100. Referring to FIG. 7B, the end effector 72 is moved laterally so that a base 117 of flange 116 fits into gap 92. Finally, referring to FIG. 7C, end effector 72 is moved vertically upward so that an inner rim 94 of the end effector 72 contacts an underside 119 of flange 116 to lift the cassette 100. The end effector 72 may then be moved laterally to carry cassette 100 to another support shelf 62 or to the loading platform 52 or to a docking platform 42.

Referring to FIGS. 7A–8A, a cassette 100 may be transported from loading platform 52 to a support shelf, such as support shelf 62c. With support strut 74 positioned to the side of loading platform 52, a cassette 100 is loaded onto the loading platform 52, either manually or by an AGV. To lift the cassette 100 off loading platform 52, end effector 72 is positioned to the left of the cassette at a vertical height between upper surface 118 of the cassette 100 and the lower surface of flange 116. The support strut 74 moves rightwardly until end effector 72 engages the support flange (phantom line A). Then, the end effector 72 moves upwardly to raise the cassette 100 off of the loading platform 52 (phantom line B). To move the cassette 100 to one of the support shelves, e.g., support shelf 62c, end effector 72 raises the cassette 100 until the cassette 100 is generally aligned above the support shelf 62c, with sufficient vertical clearance to permit the underside of the cassette 100 to move horizontally over support pins 64 (phantom line C). Then support strut 74 is moved leftwardly to position the cassette 100 over the support shelf 62c, and the end effector 72 moves downwardly until the cassette 100 rests on support pins 64 (phantom line D). The end effector 72 may be withdrawn by moving it leftwardly until it clears the flange 116, and then moving it upwardly and rightwardly between the top of the flange 116 and the bottom of support shelf 62b (phantom line E).

Figure 8A:
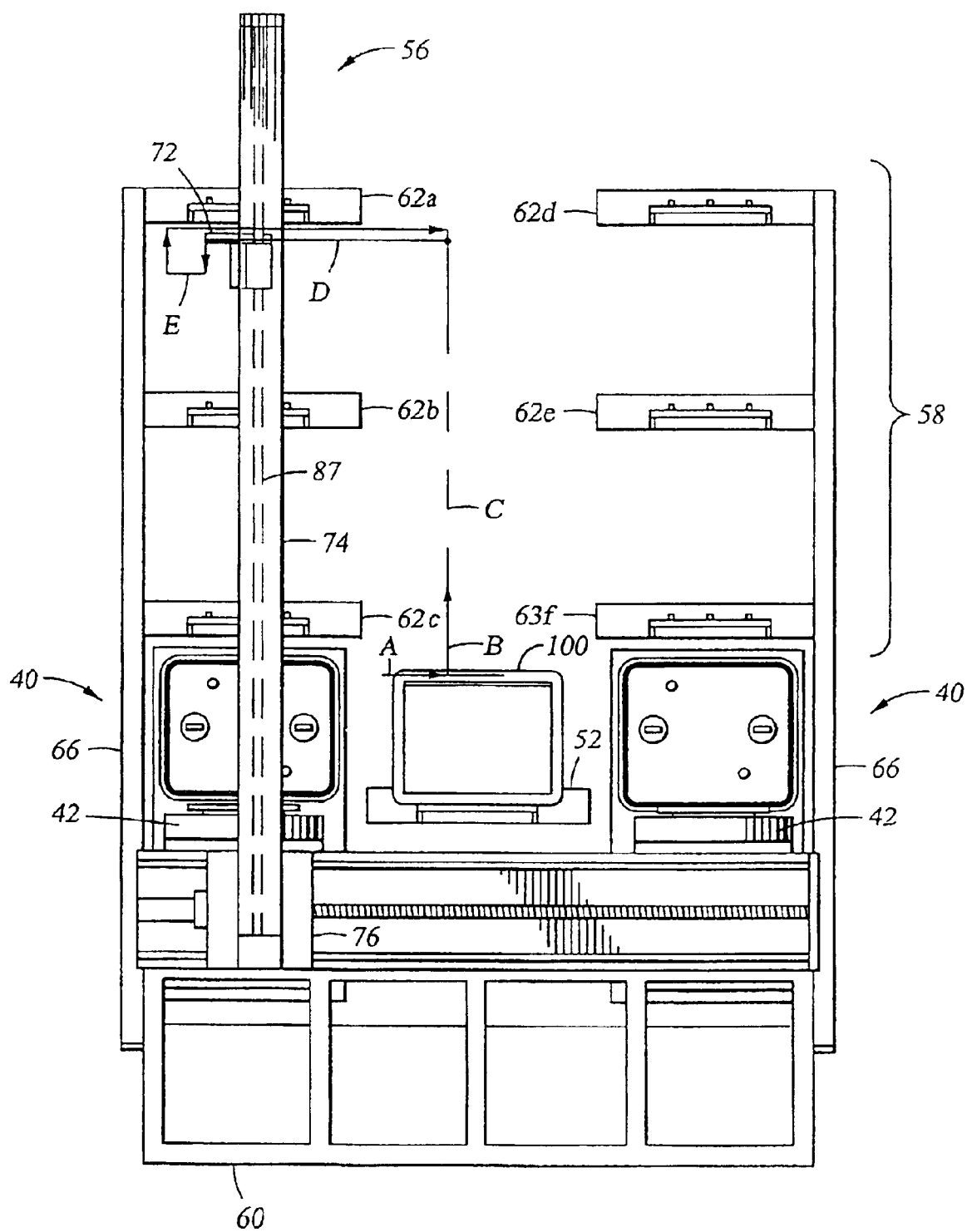
FIGS. 8A and 8B are schematic front views of the cassette stocker of FIG. 3 illustrating the path the end effector of FIG. 6 takes in moving a cassette between a loading platform and a cassette docking platform.
Figure 8B:
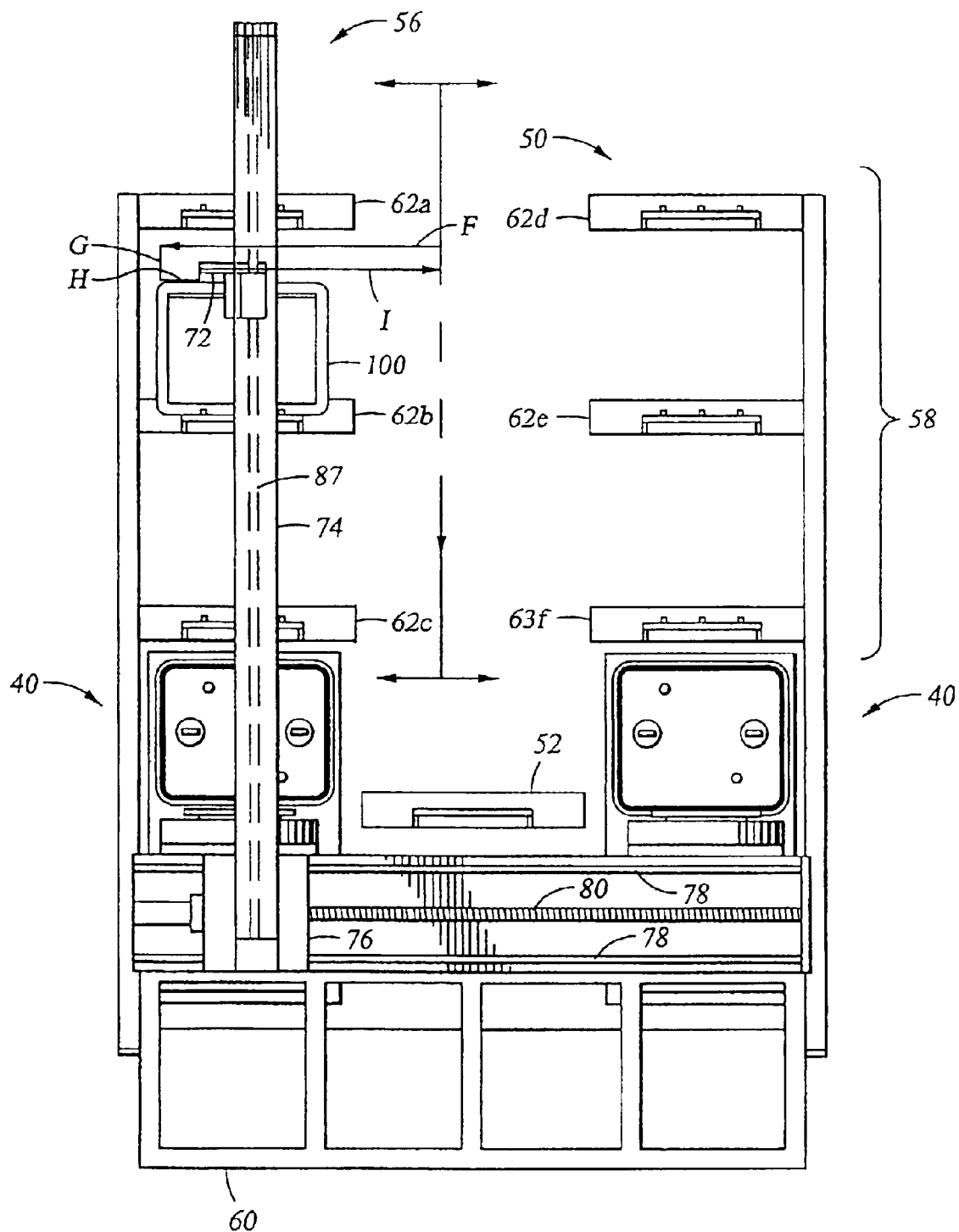

Referring to FIG. 8B, in order to remove the cassette 100 from support shelf 62c, these steps are generally repeated in reverse order. Specifically, end effector 72 moves leftwardly between the top of flange 116 and the bottom of support shelf 62b (phantom line F), downwardly until the end effector 72 is located at a vertical position between the top surface of the cassette 100 and the underside of the flange 116 (phantom line G), and rightwardly until it engages the flange 116 (phantom line H). Then the end effector 72 moves upwardly to lift the cassette 100 off the support plate 62b and then rightwardly to carry the cassette 100 into the vertical channel between the storage racks 58 (phantom line I). From this position, the cassette 100 may be moved up or down and then left or right to a new storage shelf, to one of the docking platforms 42, or to the loading platform 52.

In the embodiments described in FIGS. 7A–8B, hook-shaped finger 90 of end effector 72 curves to the right so that rectangular gap 92 is open on the right. Of course, if hook-shaped finger 90 curved to the left so that rectangular gap 92 was open on the left, then the relative lateral motion of the end effector to engage and disengage the cassette 100 would be reversed. For example, to lift the cassette 100 from a support shelf 62b, the end effector 72 would be positioned on the right side of the cassette 100 and moved leftwardly to engage the flange 116.

Figure 3:
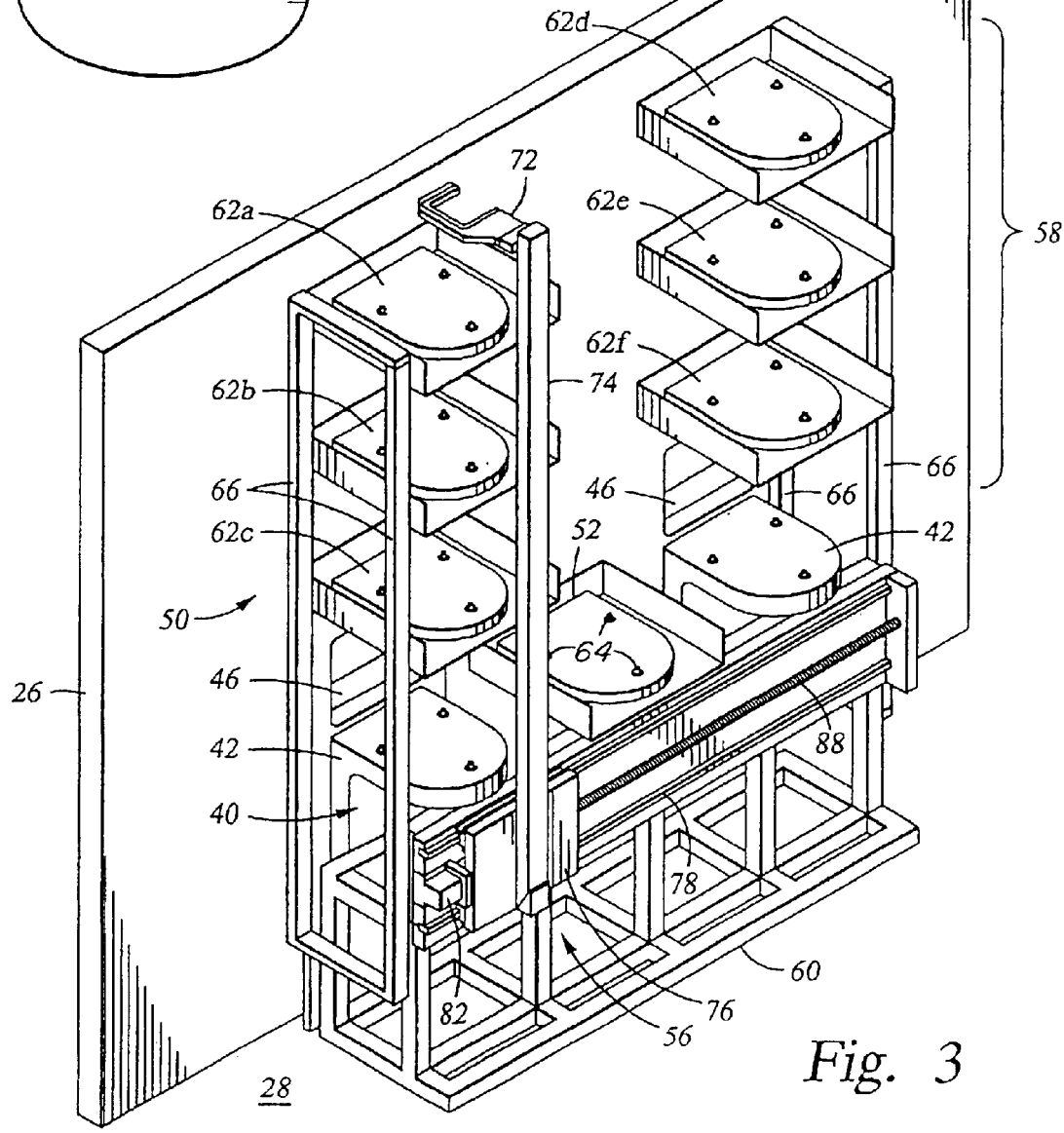
FIG. 3 is a schematic perspective view of a cassette stocker according to the present invention.
Figure 4A:
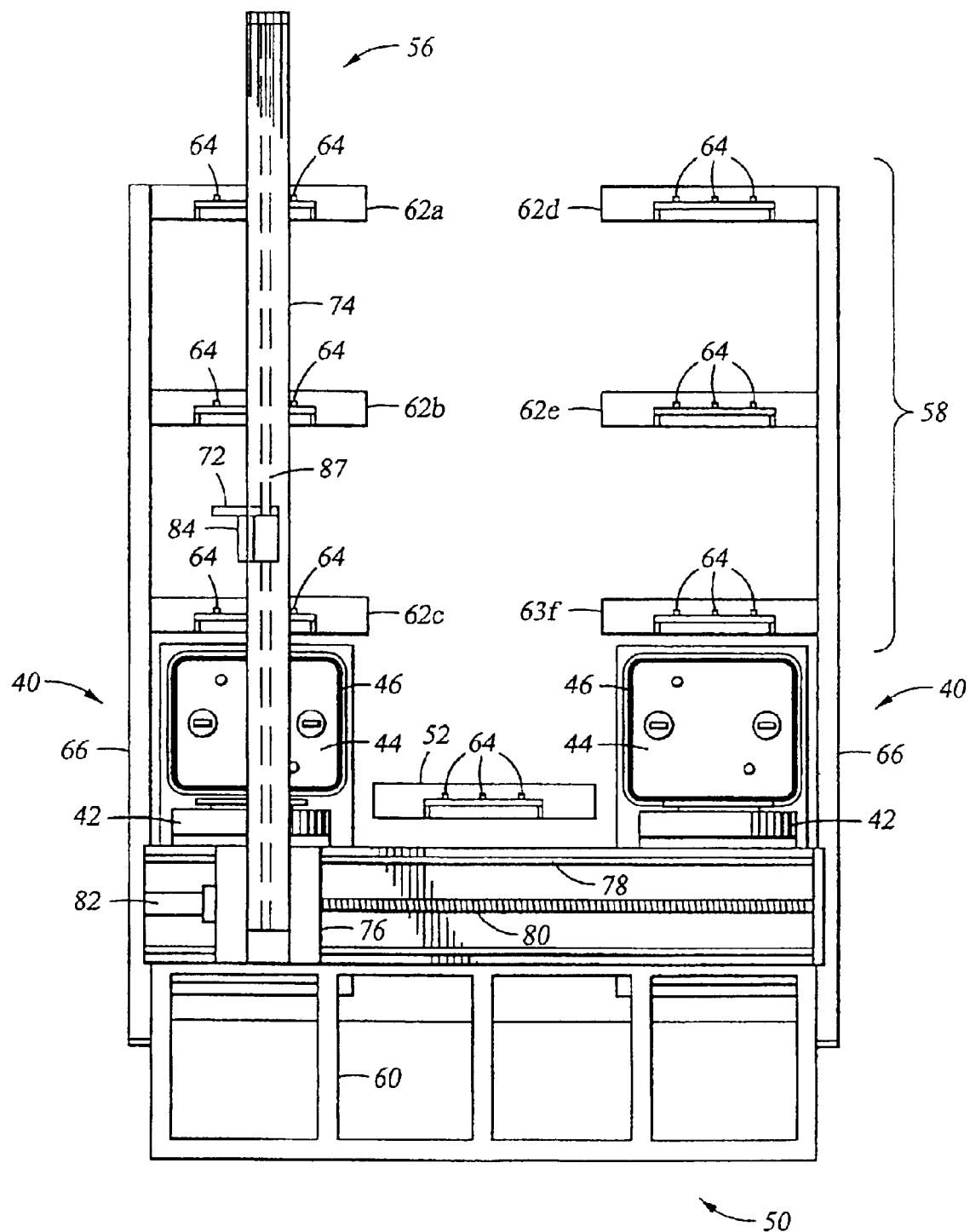
FIG. 4A is a schematic front view of the cassette stocker of FIG. 3.
Figure 4B:
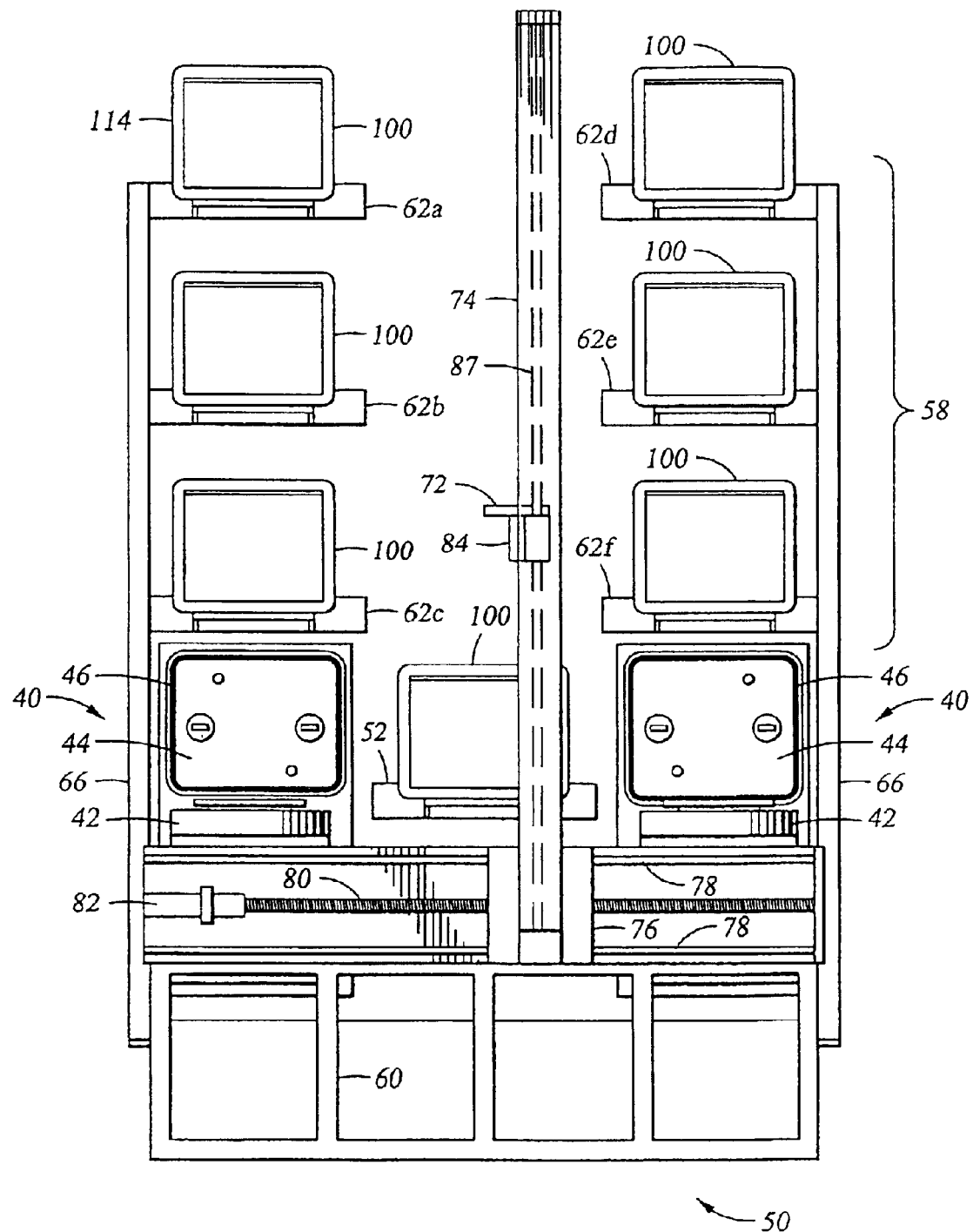
FIG. 4B is a schematic front view of the cassette stocker of FIG. 4A with a plurality of cassettes.
Figure 5A:
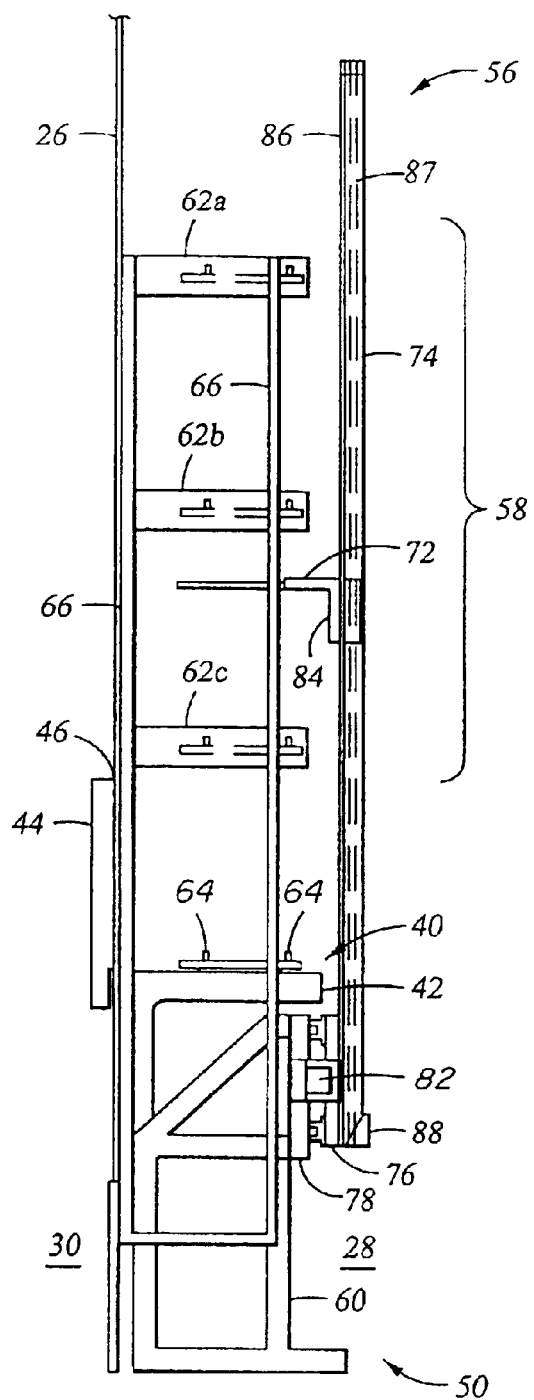
FIG. 5A is a schematic side view of the cassette stocker of FIG. 3.
Figure 5B:
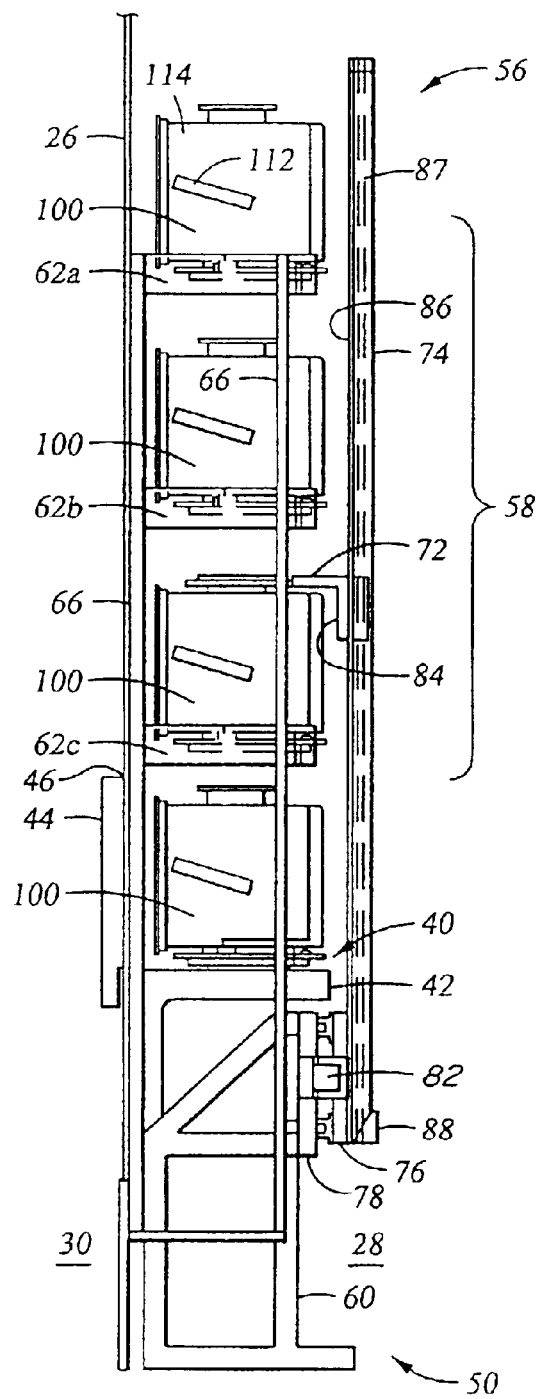
FIG. 5B is a schematic side view of the cassette stocker of FIG. 3 with a plurality of cassettes.

Referring to FIGS. 1–3, in operation a cassette 100 is transported to processing station 20 and placed on loading platform 52, e.g., manually or by an AGV. The robotic cassette mover 56 transports the cassette from the loading platform 52 to one of the docking stations 40, which aligns the front face of the cassette 100 with docking station door 44. Docking station door 44 then retracts, opening cassette door 104 so that entry port 102 mates with opening 46 in cleanroom wall 26. A wafer handling robot 48 in front-end staging area 22 extracts the substrates from the cassette 100 through opening 46 in the cleanroom wall 26 and inserts the substrates into one of the load lock chambers 34. A robot 39 in transfer chamber 36 moves substrates between the load lock 34 and the processing chambers 38. When the fabrication steps are complete, wafer handling robot 48 extracts the substrate from one of the lock load chambers 34, and returns the substrate to cassette 100 through opening 46 in cleanroom wall 26. Once all of the substrates have been processed, cassette door 104 is closed, the cassette 100 is moved to storage rack 58 or loading platform 52, and a new cassette 100 containing unprocessed substrates is loaded onto the docking station 40.

As stated above, the processing system could perform inspection processes using metrology devices instead of or in addition to fabrication steps. Metrology stations typically sample and test processed and/or unprocessed wafers stored within the wafer cassettes 100. Typically, a metrology station may test as few as one wafer within each wafer cassette 100 selected for metrology, the cassette 100 being selected randomly or based on some pre-determined selection criteria according to standard metrology principles. Accordingly, each wafer cassette 100 presented for metrology may have significantly less resident time at a particular docking station 40 operated in connection with a metrology station than if the wafer cassette 100 were presented for processing in a processing station. As a result, the time required to open and close the doors and the time required to move a first cassette 100 from the docking station 40 and replace the first cassette 100 with a second cassette 100 may result in undesirable downtime of the metrology station if only one or two docking stations 40 are employed. Further, certain processing stations, particularly those with short processing times, may also have unnecessary downtime as a result of using only one or two docking stations 40.

Figure 9:
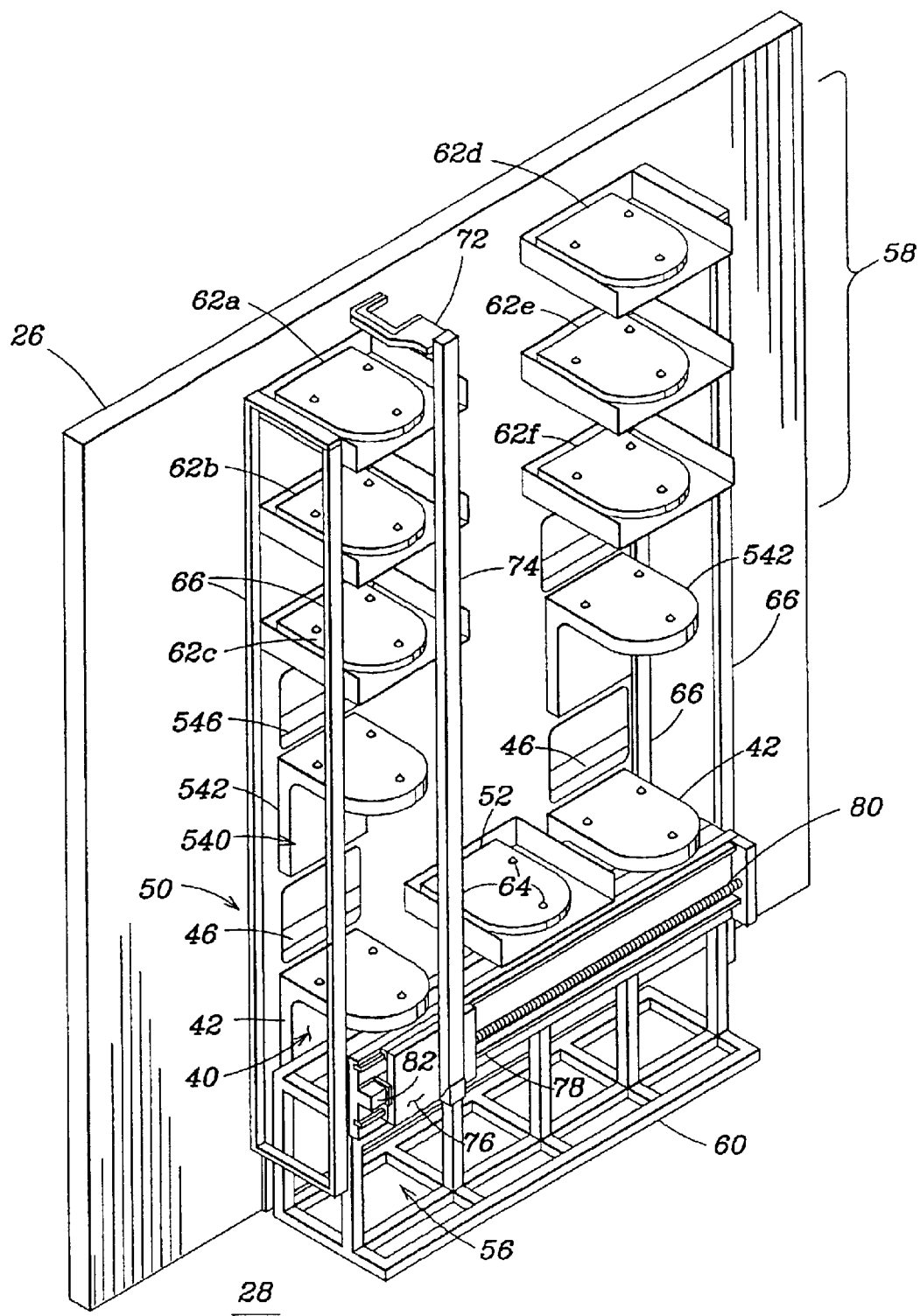
FIG. 9 is a schematic perspective view of another embodiment of a cassette stocker having a plurality of vertically disposed docking stations.
Figure 10:
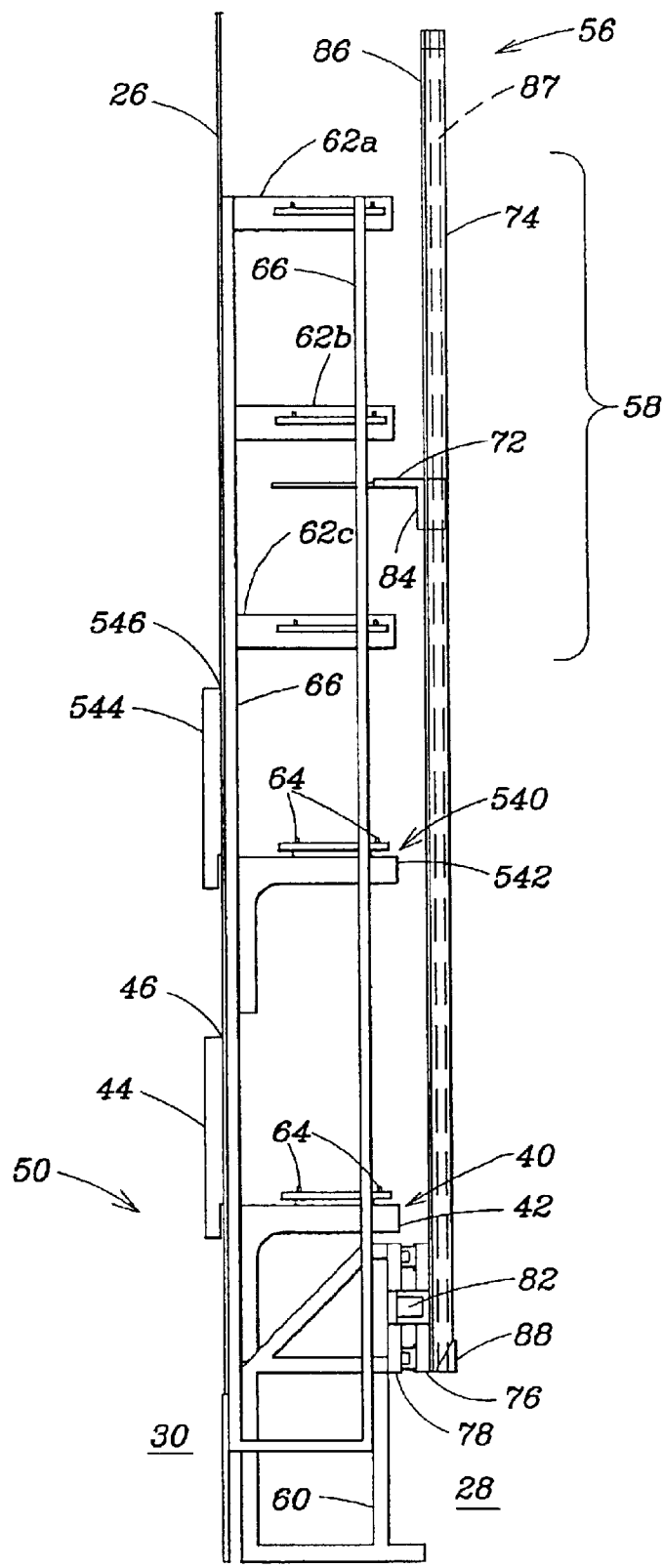
FIG. 10 is a schematic side view of the cassette stocker of FIG. 9.
Figure 11:
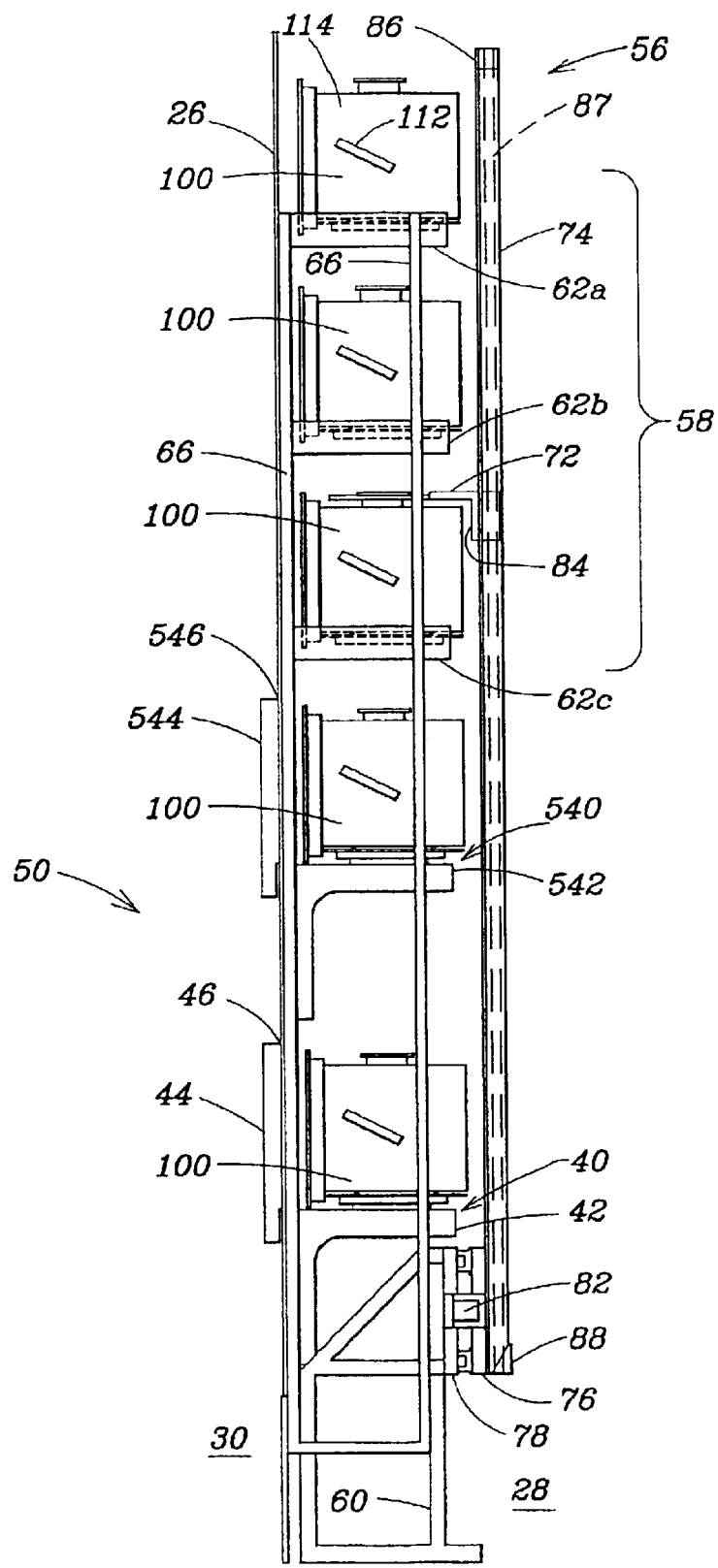
FIG. 11 is a schematic side view of the cassette stocker of FIG. 9 with a plurality of cassettes.

Therefore, it may be desirable to incorporate a plurality of vertically stacked docking stations in connection with each storage rack 58. FIGS. 9–11 illustrate a stacked docking station embodiment of a loading and storage area 24 of processing station 20 having two lower substrate docking stations 40 and two upper substrate docking stations 540. As in the previous embodiments, the loading and storage area 24 of processing station 20 includes a cassette loading platform 52, two lower cassette docking or substrate transfer stations 40 located on either side of loading platform 52, and cassette stocker or storage stations 50 for storing cassettes 100 at the processing station and moving the cassettes 100 to and from loading platform 52 and docking stations 40. This embodiment, however, also includes two upper cassette docking or substrate transfer stations 540 each of which is located above one of the docking stations 40. The docking stations thus at least partially overlap, and preferably completely overlap, in footprint. The vertically disposed docking stations are also vertically disposed relative to one or (preferably) more of the support shelves 62.

According to this embodiment, a cassette 100 may be placed onto or removed from loading platform 52 either manually or by an AGV. To transfer substrates through the cleanroom wall 26, cassettes 100 may be positioned at one of the lower docking stations 40 or also at one of the upper docking stations 540. Each lower docking station 40 includes a lower docking platform 42 to support a cassette 100, a lower opening 46 formed through cleanroom wall 26, a lower movable door 44 which seals lower opening 46 when a substrate is not to be transferred through lower opening 46 or when a cassette 100 is not positioned on lower docking platform 42, and a mechanism to unlock cassette door 104 and retract the door 104 into front-end staging area 22 so as to provide horizontal access to the substrate. Each upper docking station 540 likewise includes an upper docking platform 542 to support a cassette, an opening 546 formed through cleanroom wall 26, an upper movable door 544 which seals upper opening 546 when a substrate is not to be transferred through upper opening 546 or when a cassette 100 is not positioned on upper docking platform 542, and a mechanism to unlock cassette door 104 and retract the door 104 into front-end staging area 22 to provide horizontal access to the substrate.

Figure 14:
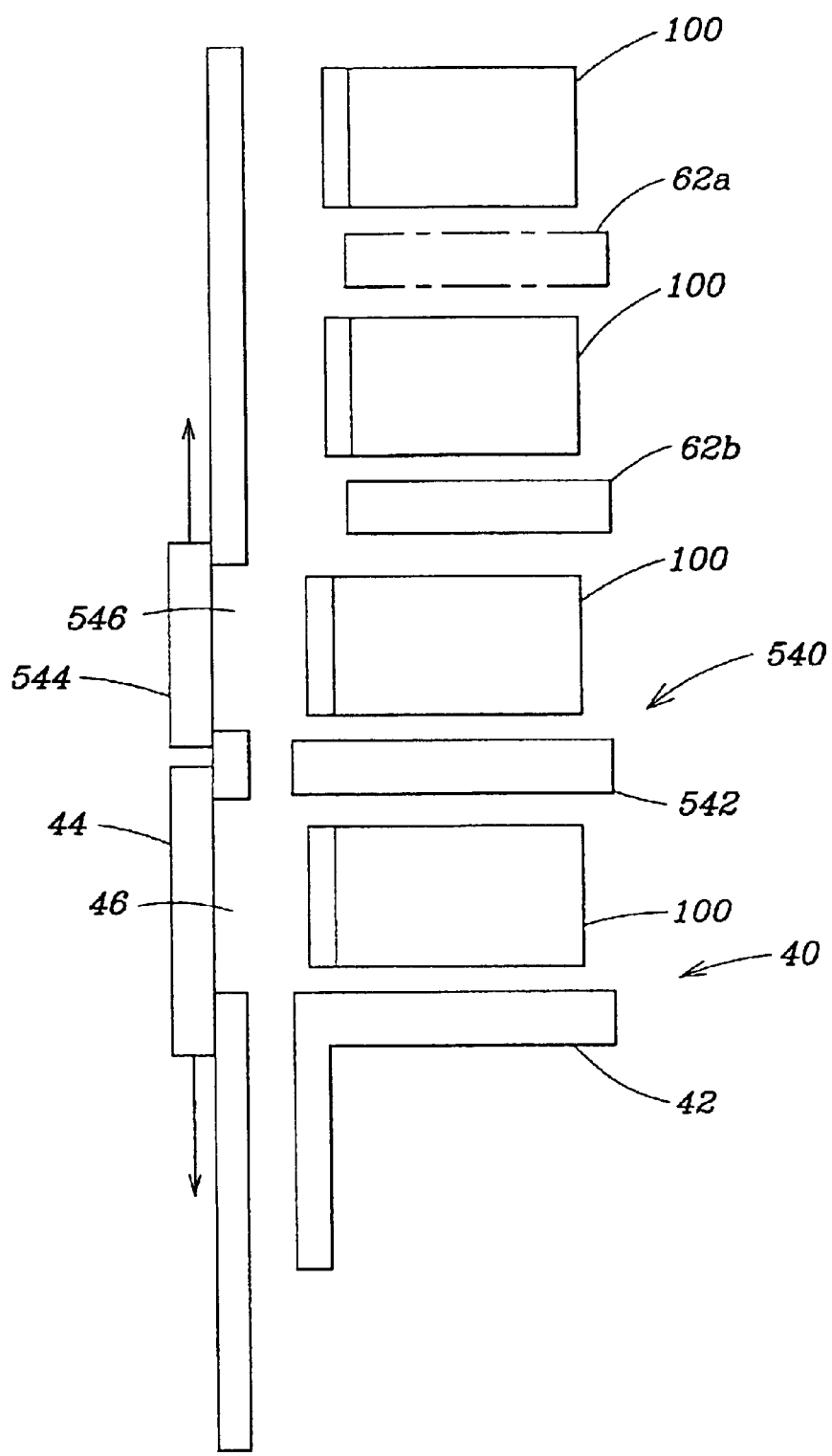
FIG. 14 is a simplified side schematic view of a cassette stocker having a single pair of vertically disposed docking stations, the doors of which open in opposite directions.

Upper docking station 540 is of similar construction and operation as lower docking station 40. Similarly, upper movable door 544 is of similar construction and operation as lower movable door 44. Suitable space is provided between upper opening 546 and lower opening 46 so that downward movement of the upper movable door 544 does not interfere with the operation of lower movable door 44 as will be readily appreciated by one of ordinary skill in the art. In an alternative embodiment, upper movable door 544 could be arranged to open upwardly allowing the two doors 44, 544 and the two docking stations 540, 40 to be located closer together (as shown in FIG. 14). It will also be readily appreciated by one of ordinary skill in the art that transport of the cassette 100 to upper docking platform 542 and operation of the system are similar to that described in other embodiments. The embodiment described herein has an upper and lower docking station 40, 540 associated with each of the storage racks 58. However, it should be noted that a plurality of upper docking stations 540 may be used limited only by available vertical space. Further, the upper docking station 540 and the lower docking station 40 may be separated by one or more of the support shelves 62, or both the upper and lower docking stations may be positioned above one or more of the plurality of storage shelves 62.

Figure 13:
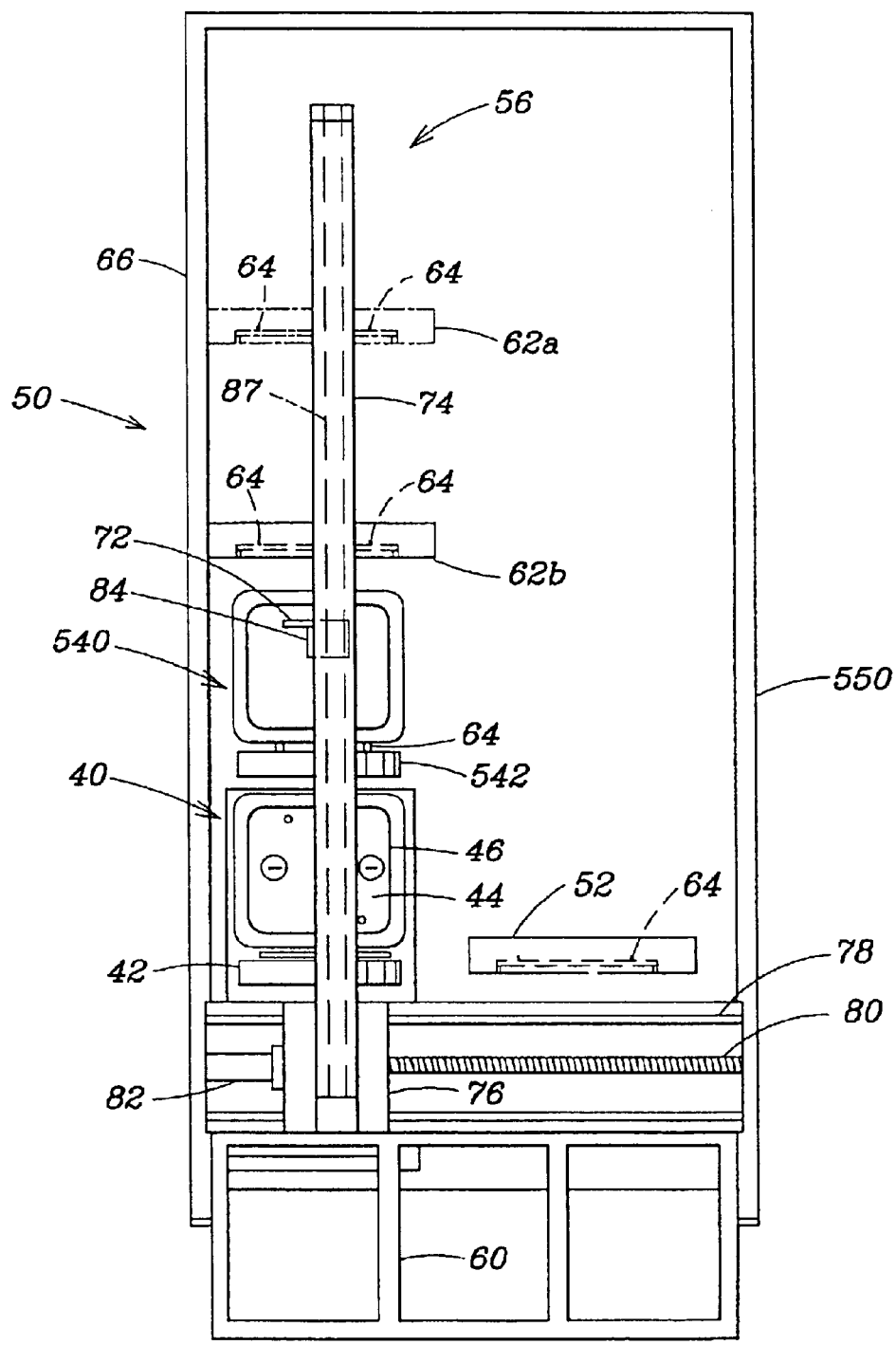
FIG. 13 is a schematic front view of a cassette stocker having a single pair of vertically disposed docking stations.

The embodiment described above also includes two storage racks 58 disposed above two pairs of docking stations 40, 540 and a loading station 52 disposed between the two docking stations. Preferably, six cassette support shelves 62a–f are disposed above the docking stations 40, 540. While this configuration is believed to provide the highest throughput of substrates in the available space, the invention also includes a single pair of docking stations 40, 540 as shown in FIG. 13 with one or more cassette support shelves 62 disposed in proximity to the docking stations 40, 540.

Figure 12:
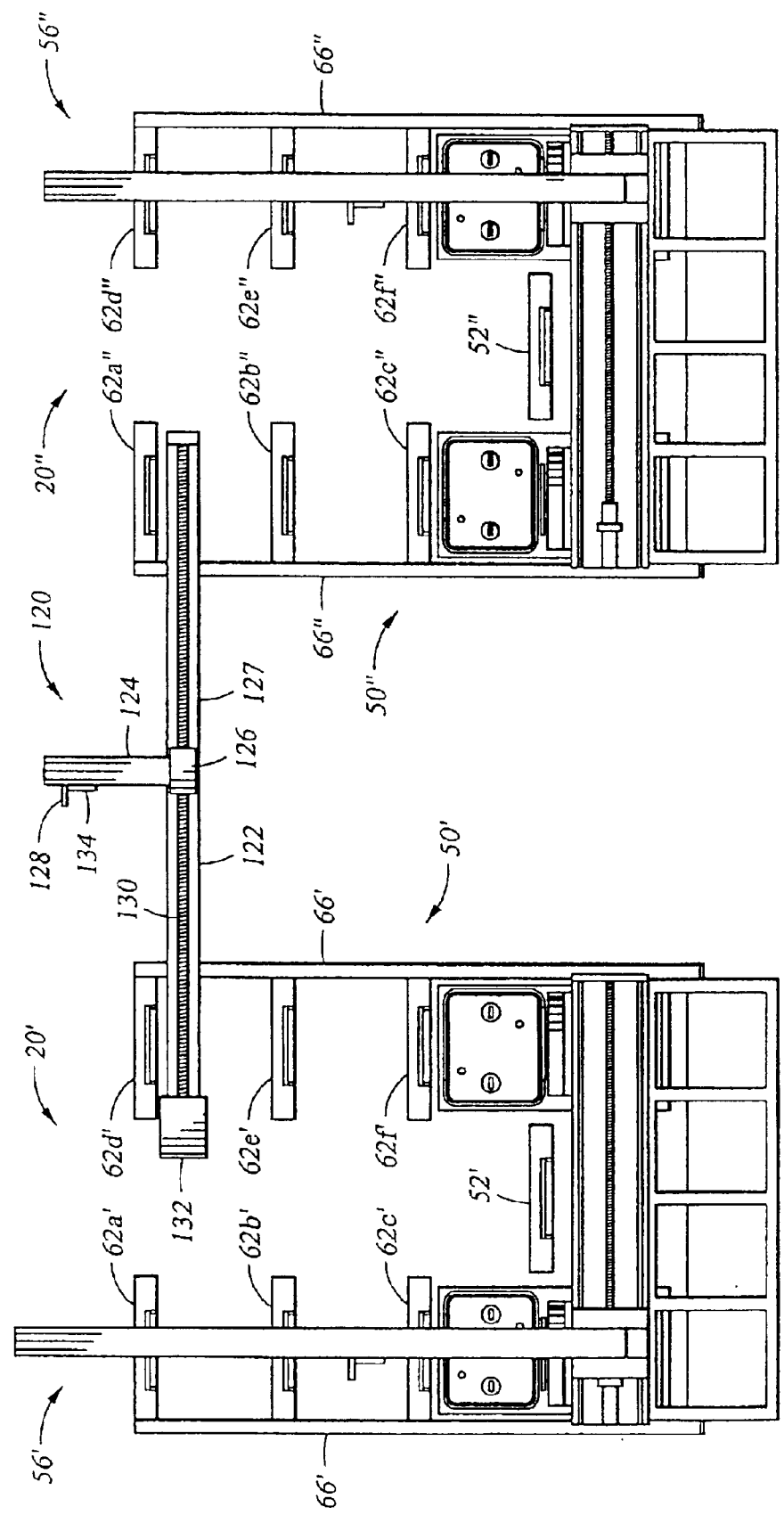
FIG. 12 is a schematic front view of two loading and storage stations connected by an interstation transfer mechanism.

FIG. 9 is a perspective view of one embodiment of the invention having two pairs of docking stations 40, 540 and three storage shelves 62a–c or 62d–f disposed above each of the pair of docking stations 40, 540. While three support shelves 62a–c or 62d–f are shown, only one support shelf 62a or 62d could also be used advantageously. Components which form a part of the earlier described embodiments are identified using the same reference numerals. FIGS. 10 and 11 further depict docking stations 40, 540 and storage shelves 62a–c in a side view, shown with and without cassettes, respectively. Referring to FIG. 12, an interstation transfer apparatus 120 may be used to move cassettes 100 between adjacent processing stations 20' and 20", thereby eliminating the need for AGVs or manual transport. Interstation transfer apparatus 120 includes an overhead support beam 122 which may be secured to posts 66' and 66" of adjacent cassette stockers 50' and 50". A transfer arm 124 may be attached to a slider 126 that moves horizontally along a guide 127 that is attached to or formed as part of support beam 122. The slider 126 may be moved horizontally by a lead screw 130 which may be rotated by a horizontal drive motor 132. An end effector 128 may be connected to transfer arm 124 by a pneumatic actuator 134 to provide end effector 128 with a short vertical stroke.

In order to transport the cassettes 100 between adjacent processing stations 20', 20", the cassette 100 is moved by robotic cassette mover 56' to the upper right-hand support shelf, i.e., support shelf 62d', of cassette stocker 50'. End effector 128 moves horizontally over flange 116, then down to a vertical position between the bottom of the flange and the top of the cassette. Then the end effector 128 moves to the right until it engages the cassette flange 116. End effector 128 lifts the cassette 100 off support plate 62d', and horizontal drive motor 132 drives the transfer arm 124 rightwardly until the cassette 100 is located over the upper left-hand support shelf 62a" of cassette stocker 50". Finally, the end effector 128 lowers the cassette 100 onto support shelf 62a" and withdraws.

Interstation transfer apparatus 120 provides an extremely simple method of transferring cassettes 100 between adjacent processing stations 20', 20". This may be particularly useful where one of the processing stations is a metrology station (which could be located entirely inside the cleanroom 28), since it permits the metrology measurements to be made without building a metrology apparatus into the processing equipment 20', 20" and without using a factory automation system 22.

Although cassette stockers 50' and 50" are illustrated as positioned against the same cleanroom wall 26, the interstation transfer apparatus 120 could include rotary mechanisms to allow handoff between end effectors 128 on different support beams. This would permit processing stations 20' and 20" to be positioned around the corners or at opposite walls of the cleanroom.

The embodiments described above include two storage racks 58, each disposed above docking stations 40, 540 and a loading station 52 disposed between the two storage racks 58. Preferably, six cassette support shelves 62a–f are disposed above each of the one or more docking stations. While this configuration is believed to provide the highest throughput of substrates in the available space, the invention also includes a single pair of docking stations 40, 540 with one or more cassette support shelves 62 disposed in proximity to the docking stations 40, 540. FIGS. 13 and 14 are front views of cassette stockers having a single pair of docking stations 40, 540 and two storage shelves 62a–b disposed above the docking stations 40, 540. The upper moveable door 544 opens downwardly in FIG. 13, and upwardly in FIG. 14. When the upper door 544 opens upwardly as shown in FIG. 14, the two docking stations 540, 40 can be located closer together so as to reduce the overall height of the cassette stocker. In both embodiments of FIGS. 13 and 14 support shelf 62a is shown in phantom to indicate that only one support shelf 62b could be advantageously used. An enclosure 550 is disposed about the docking stations 40, 540, the loading station 52 and the cassette support shelves 62. Components which form a part of the earlier described embodiments are identified using the same numbers.

Substrates may be loaded into the system 20 at either a docking station 40, 540 position, at any one of the storage shelf positions 62 or at a loading station 52. The loading station 52 could be disposed adjacent either a support shelf 62 or a docking station 40, 540. The substrate mover system described above with reference to the other embodiments is utilized with the single stack embodiment of FIG. 13 and operates in the same manner except that support shelves 62 disposed in a single stack eliminate the transfer sequence from the additional stack.

Each of the embodiments described herein utilizes available space above or below docking stations, thereby increasing the storage capability of the system without increasing the footprint (area occupied by the system measured in terms of floor space) of the system. Although the storage shelves shown herein are located above the pair of docking stations, it will be understood that one or more storage shelves could be located below, or between the plurality of vertically disposed docking stations. Accordingly, a processing system could utilize any configuration of the storage device of the present invention including cassette support shelves disposed adjacent a docking station. Further, although a vertically arranged pair of docking stations is preferably associated with each stack of one or more support shelves, a pair of horizontally disposed docking stations may be associated with each stack of support shelves. In such a horizontal configuration each docking station is coupled to a separate tool. The separate tools are preferably high throughput tools (metrology tools, etc.). Preferably, a cassette mover is also disposed in proximity to the support shelves and the docking station to effect transfer of cassettes between the support shelves and the docking stations. Accordingly, while the present invention has been disclosed in connection with the preferred embodiments thereof, it should be understood that other embodiments may fall within the spirit and scope of the invention, as defined by the following claims.

What is claimed is:

1. A fabrication system, comprising:
   a first processing station to perform a process on a substrate, the first processing station having a first docking station, a first frame, a plurality of cassette storage shelves fixedly mounted on the first frame and positioned above the first docking station, a second docking station positioned above the first docking station, and a cassette mover mounted on the first frame to carry a cassette among the plurality of shelves and the first and second docking stations;
   a second processing station to perform a process on a substrate, the second processing station having a third docking station, a second frame, a plurality of cassette storage shelves fixedly mounted on the second frame and positioned above the third docking station, a fourth docking station positioned above the third docking station and a cassette mover mounted on the second frame to carry a cassette between the plurality of shelves and the third and fourth docking stations; and
   an interstation cassette mover to transport a cassette between one of the plurality of shelves of the first processing station and one of the plurality of shelves of the second processing station.

2. The fabrication system of claim 1, wherein the first processing station performs a first fabrication step.

3. The fabrication system of claim 1, wherein at least one of the first and second processing stations is a metrology system.

4. The fabrication system of claim 1, wherein the shelves and the first and second docking stations of the first processing station are arranged in vertical columns, the shelves and the third and fourth docking stations of the second processing station are arranged in vertical columns, and the interstation cassette mover transports a cassette between a topmost shelf of each of the first and second processing stations.

5. The fabrication system of claim 1, wherein the interstation cassette mover includes a support member positioned adjacent the shelves and movable in a path parallel to a cleanroom wall, and an end effector configured to engage a cassette, the end effector adapted to move vertically relative to the support member.

6. The fabrication system of claim 5, wherein the interstation cassette mover further includes a supporting part mounted between the plurality of cassette storage shelves of the first processing station and the plurality of cassette storage shelves of the second processing station, and wherein the supporting member is movably mounted on the supporting part.

7. The fabrication system of claim 1, wherein the interstation cassette mover includes:
   a support member positioned adjacent the shelves and movable in a path parallel to a cleanroom wall;
   an end effector configured to engage a cassette and adapted to move vertically relative to the support member; and
   a supporting part mounted between the respective frames of the first and second processing stations, the support member being movably mounted on the supporting part.

8. An apparatus for storing cassettes, comprising:
   a pair of vertically disposed docking stations positionable adjacent a cleanroom wall;
   a frame;
   one or more cassette storage shelves, fixedly mounted on the frame, positionable adjacent the cleanroom wall and adjacent the pair of cassette docking stations; and
   a cassette mover mounted on the frame and disposed adjacent the pair of vertically disposed docking stations and the one or more cassette storage shelves.

9. The apparatus of claim 8 wherein the one or more cassette storage shelves are disposed above at least one of the pair of vertically disposed docking stations.

10. The apparatus of claim 8 wherein the cassette mover comprises a vertical slider and a lateral slider.

11. The apparatus of claim 10 further comprising a loading station disposed adjacent one of the pair of vertically disposed docking stations.

12. The apparatus of claim 11 further comprising an enclosure disposed about the pair of vertically disposed docking stations, the loading station, and the one or more cassette storage shelves.

13. The apparatus of claim 8, wherein each docking station of the pair of vertically disposed docking stations includes a respective door adapted to seal a corresponding opening in the cleanroom wall.

14. The apparatus of claim 8 wherein the frame is positionable adjacent the cleanroom wall.

15. The apparatus of claim 14, wherein each docking station of the pair of vertically disposed docking stations includes a docking platform adapted to support a cassette, and wherein the frame is at least partially disposed beneath at least one of the docking platforms.

16. A method of operating a processing station, comprising:
   storing a plurality of cassettes on a plurality of cassette storage shelves, fixedly mounted on a frame which is adjacent a cleanroom wall, the shelves being disposed vertically relative to a pair of vertically disposed docking stations;
   carrying one of the cassettes to one of the docking stations with a cassette mover, mounted on the frame;
   removing a substrate from the cassette;
   performing a metrology process on the substrate; and
   returning the cassette to the cassette storage shelves with the cassette mover.

17. A semiconductor processing station, comprising:
   an processing system to perform a process on a substrate;
   an interface wall separating the processing system from a cleanroom;
   a pair of vertically disposed docking stations located in the cleanroom and adapted to support a cassette;
   a pair of openings in the interface wall, each opening positioned between one of the docking stations and the processing system;
   a wafer transfer robot adapted to transfer a substrate through the openings in the interface wall between the docking stations and the processing system; and
   a cassette stocker located in the cleanroom, the cassette stocker including,
   i) a frame;
   ii) a plurality of shelves fixedly mounted on the frame and aligned in a vertical column above at least one of the pair of docking stations, and
   iii) a cassette mover mounted on the frame and adapted to carry a cassette between the shelves and the docking stations, the cassette mover including a support member positioned adjacent the shelves and movable in a path generally parallel to the shelves, and an end effector slidably connected to the support member and configured to engage a cassette.

18. The apparatus of claim 17, further comprising a loading platform located in the cleanroom adjacent the docking station, and wherein the cassette mover is adapted to carry a cassette between the shelves, the loading platform and the docking stations.

19. The semiconductor processing station of claim 17, wherein the frame is positioned adjacent the interface wall.

20. The semiconductor processing station of claim 19, wherein each docking station of the pair of vertically disposed docking stations includes a docking platform adapted to support a cassette, and wherein the frame is at least partially disposed beneath at least one of the docking platforms.

21. The semiconductor processing station of claim 17, wherein each docking station of the pair of vertically disposed docking stations includes a respective door adapted to seal the respective opening in the interface wall.

22. The semiconductor processing station of claim 17, wherein the end effector is configured to engage a cassette by moving in at least one of a vertical direction and a horizontal direction, and wherein the cassette mover further comprises a mechanism adapted to impart movement to the cassette mover.

23. An apparatus for storing cassettes, comprising:
   a frame;
   a plurality of cassette storage shelves fixedly mounted on the frame;
   a plurality of vertically disposed docking stations; and
   a cassette mover to carry a cassette between the shelves and the docking stations, the cassette mover mounted on the frame, having a Support member disposed adjacent the shelves, and being adapted to move in a path generally parallel to the shelves; and an end effector movably connected to the support member and configured to engage a cassette.

24. The apparatus of claim 23, wherein one or more of the shelves are positioned above at least one of the plurality of docking stations.

25. The apparatus of claim 23 wherein one or more of the shelves are positioned vertically below at least one of the plurality of docking stations.

26. The apparatus of claim 23, wherein each docking station of the plurality of vertically disposed docking stations includes a respective door adapted to seal a corresponding opening in a cleanroom wall.

27. The apparatus of claim 23, wherein the end effector is configured to engage a cassette by moving in at least one of a vertical direction and a horizontal direction, and wherein the cassette mover further comprises a mechanism adapted to impart movement to the cassette mover.

28. The apparatus of claim 23 wherein the frame is positionable adjacent a cleanroom wall.

29. The apparatus of claim 28, wherein each docking station of the plurality of vertically disposed docking stations includes a docking platform adapted to support a cassette, and wherein the frame is at least partially disposed beneath at least one of the docking platforms.

30. An apparatus for storing cassettes, comprising:
   a frame;
   a first and second plurality of cassette storage shelves fixedly mounted on the frame;
   a first and second plurality of vertically disposed docking stations; and
   a cassette mover, mounted on the frame, to carry a cassette between the shelves and the docking stations, the cassette mover having a support member disposed adjacent the shelves and movable in a path generally parallel to the shelves and an end effector movably connected to the support member and configured to engage a cassette.

31. The apparatus of claim 30, wherein the first plurality of shelves are positioned vertically relative to the first plurality of docking stations and the second plurality of shelves are positioned vertically relative to the second plurality of docking shelves.

32. The apparatus of claim 31, wherein:
the first plurality of shelves is arranged in a vertical column positioned vertically relative to the first plurality of vertically disposed docking stations;
the second plurality of shelves is arranged in a vertical column positioned vertically relative to the second plurality of vertically disposed docking stations; and
the first and second plurality of shelves are separated by a vertical channel sized to permit movement of a cassette therethrough in a vertical direction.

33. The apparatus of claim 32, further comprising a loading platform positioned vertically below the vertical channel.

34. The apparatus of claim 1, wherein an upper one of the vertically disposed docking stations comprises a door adapted to open upwardly, and
a lower one of the vertically disposed docking stations comprises a door adapted to open downwardly.

35. The apparatus of claim 30, wherein the frame is positionable adjacent a cleanroom wall.

36. The apparatus of claim 35, wherein each docking station of the first and second plurality of vertically disposed docking stations includes a docking platform adapted to support a cassette, and wherein the frame is at least partially disposed beneath at least one of the docking platforms.

37. The apparatus of claim 30, wherein each of the first and second plurality of vertically disposed docking stations includes a respective door adapted to seal a corresponding opening in a cleanroom wall.

38. The apparatus of claim 30, wherein the end effector is configured to engage a cassette by moving in at least one of a vertical direction and a horizontal direction, and wherein the cassette mover further comprises a mechanism adapted to impart movement to the cassette mover.

39. An apparatus for storing cassettes, comprising:
a plurality of cassette storage shelves;
a plurality of vertically disposed docking stations; and
a cassette mover to carry a cassette between the shelves and the docking stations, the cassette mover having a support member disposed adjacent the shelves, and being adapted to move in a path generally parallel to the shelves; and an end effector movably connected to the support member and configured to engage a cassette;
wherein one or more of the shelves are positioned vertically below at least one of the plurality of docking stations.

40. A fabrication system, comprising:
a first processing station to perform a process on a substrate, the first processing station having a first docking station, a plurality of cassette storage shelves positioned above the first docking station, a second docking station positioned above the first docking station, and a cassette mover to carry a cassette among the plurality of shelves and the first and second docking stations;
a second processing station to perform a process on a substrate, the second processing station having a third docking station, a plurality of cassette storage shelves positioned above the third docking station, a fourth docking station positioned above the third docking station and a cassette mover to carry a cassette between the plurality of shelves and the third and fourth docking stations; and
an interstation cassette mover to transport a cassette between one of the plurality of shelves of the first processing station and one of the plurality of shelves of the second processing station;
wherein an upper one of the first and second docking stations comprises a door adapted to open upwardly, and a lower one of the first and second docking stations comprises a door adapted to open downwardly; and
wherein an upper one of the third and fourth docking stations comprises a door adapted to open upwardly, and a lower one of the third and fourth docking stations comprises a door adapted to open downwardly.

41. An apparatus for storing cassettes, comprising:
a first and second plurality of cassette storage shelves;
a first and second plurality of vertically disposed docking stations; and
a cassette mover to carry a cassette between the shelves and the docking stations, the cassette mover having a support member disposed adjacent the shelves and movable in a path generally parallel to the shelves and an end effector movably connected to the support member and configured to engage a cassette;
wherein the first plurality of shelves are positioned in a vertical column relative to the first plurality of docking stations and the second plurality of shelves are positioned in a vertical column relative to the second plurality of docking shelves; and
wherein the first and second plurality of shelves are separated by a vertical channel sized to permit movement of a cassette therethrough in a vertical direction.

42. The apparatus of claim 41, further comprising a loading platform positioned vertically below the vertical channel.

* * * * *